United States Patent
Schreiner et al.

(10) Patent No.: US 11,335,848 B2
(45) Date of Patent: May 17, 2022

(54) PRODUCTION OF LEAD-FREE PIEZOCERAMICS IN AQUEOUS SURROUNDINGS

(71) Applicant: CeramTec GmbH, Plochingen (DE)

(72) Inventors: Hans-Jürgen Schreiner, Hersbruck (DE); Tanja Einhellinger-Müller, Nuremberg (DE); Friederike Assmann, Rückersdorf (DE)

(73) Assignee: CERAMTEC GMBH, Plochingen (DE)

( * ) Notice: Subject to any disclaimer, the term of this patent is extended or adjusted under 35 U.S.C. 154(b) by 763 days.

(21) Appl. No.: 15/750,728

(22) PCT Filed: Aug. 8, 2016

(86) PCT No.: PCT/EP2016/068877
§ 371 (c)(1),
(2) Date: Feb. 6, 2018

(87) PCT Pub. No.: WO2017/025505
PCT Pub. Date: Feb. 16, 2017

(65) Prior Publication Data
US 2019/0006578 A1 Jan. 3, 2019

(30) Foreign Application Priority Data

Aug. 7, 2015 (DE) .......................... 102015215124.7
Dec. 18, 2015 (DE) .......................... 102015226082.8

(51) Int. Cl.
*H01L 41/187* (2006.01)
*H01L 41/43* (2013.01)
(Continued)

(52) U.S. Cl.
CPC .......... *H01L 41/318* (2013.01); *C04B 35/462* (2013.01); *C04B 35/475* (2013.01);
(Continued)

(58) Field of Classification Search
CPC ............. H01L 41/1876; H01L 41/1871; H01L 41/1873; H01L 41/1878; H01L 41/43;
(Continued)

(56) References Cited

U.S. PATENT DOCUMENTS

2002/0197461 A1* 12/2002 Takaya ................... C30B 29/30
428/210
2004/0023785 A1 2/2004 Feltz et al.
(Continued)

FOREIGN PATENT DOCUMENTS

CN 1978563 A 6/2007
CN 102701279 A 10/2012
(Continued)

OTHER PUBLICATIONS

Machine translation of JP-11029362-A, 6 pages. (Year: 1999).*
(Continued)

*Primary Examiner* — Matthew E. Hoban
*Assistant Examiner* — Lynne Edmondson
(74) *Attorney, Agent, or Firm* — Fitch, Even, Tabin & Flannery, LLP

(57) ABSTRACT

The invention relates to a method for producing ceramics having piezoelectric properties in predominantly aqueous suspending agents.

13 Claims, 1 Drawing Sheet

(51) Int. Cl.
*C04B 35/626* (2006.01)
*H01L 41/318* (2013.01)
*C04B 35/475* (2006.01)
*C04B 35/462* (2006.01)
*C04B 35/624* (2006.01)
*C04B 35/64* (2006.01)
*H01L 41/257* (2013.01)
*H01L 41/337* (2013.01)
*C04B 35/495* (2006.01)

(52) U.S. Cl.
CPC ........ *C04B 35/624* (2013.01); *C04B 35/6261* (2013.01); *C04B 35/6264* (2013.01); *C04B 35/62645* (2013.01); *C04B 35/62655* (2013.01); *C04B 35/64* (2013.01); *H01L 41/1871* (2013.01); *H01L 41/1873* (2013.01); *H01L 41/1878* (2013.01); *H01L 41/257* (2013.01); *H01L 41/337* (2013.01); *H01L 41/43* (2013.01); *C04B 35/495* (2013.01); *C04B 35/62625* (2013.01); *C04B 35/62695* (2013.01); *C04B 2235/3201* (2013.01); *C04B 2235/3215* (2013.01); *C04B 2235/3232* (2013.01); *C04B 2235/3236* (2013.01); *C04B 2235/3251* (2013.01); *C04B 2235/3298* (2013.01); *C04B 2235/442* (2013.01); *C04B 2235/606* (2013.01); *C04B 2235/96* (2013.01)

(58) Field of Classification Search
CPC ... H01L 41/318; H01L 41/337; C04B 35/462; C04B 35/475; C04B 35/491; C04B 35/62625; C04B 35/62655; C04B 35/6303; C04B 35/468; C04B 35/622; C04B 35/624; C04B 35/6261; C04B 35/6264; C04B 35/62645; C04B 35/632; C04B 35/64; C04B 35/62695; C04B 35/49; C04B 35/493; C04B 35/6262; C04B 35/6263; C04B 2235/3201; C04B 2235/3251; C04B 2235/3215; C04B 2235/3213; C04B 2235/3236; C04B 2235/3255; C04B 2235/3298; C04B 2235/3232; C04B 2235/768; C04B 2235/96; C04B 2235/3234; C04B 2235/3248; C04B 2235/346; Y10T 29/42
USPC ...................................... 252/62.9 PZ, 62.9 R
See application file for complete search history.

(56) References Cited

U.S. PATENT DOCUMENTS

| | | | |
|---|---|---|---|
| 2005/0161845 A1* | 7/2005 | Haas | C04B 35/62655 264/5 |
| 2007/0158608 A1* | 7/2007 | Feltz | H01L 41/083 252/62.9 PZ |
| 2011/0128665 A1* | 6/2011 | Nies | C04B 35/62685 361/301.4 |
| 2015/0329431 A1* | 11/2015 | Deville | C04B 35/52 428/188 |

FOREIGN PATENT DOCUMENTS

| | | |
|---|---|---|
| DE | 19740262 C1 | 4/1999 |
| DE | 19928918 A1 | 12/2000 |
| GB | 1157383 A | 7/1969 |
| JP | 11029362 A * | 2/1999 |
| JP | H11-29362 A | 2/1999 |
| JP | 2005-060213 A | 3/2005 |
| JP | 2014-501792 A | 1/2014 |
| WO | 02/06184 A1 | 1/2002 |
| WO | 2005/069396 A1 | 7/2005 |

OTHER PUBLICATIONS

International Search Report for PCT/EP2016/068877 dated Nov. 28, 2016 (7 pages).
Office Action dated May 24, 2021 in counterpart JP Appln. No. 2018-506294.
Office Action dated Oct. 5, 2020 in counterpart JP Appln. No. 2018-506294.

* cited by examiner

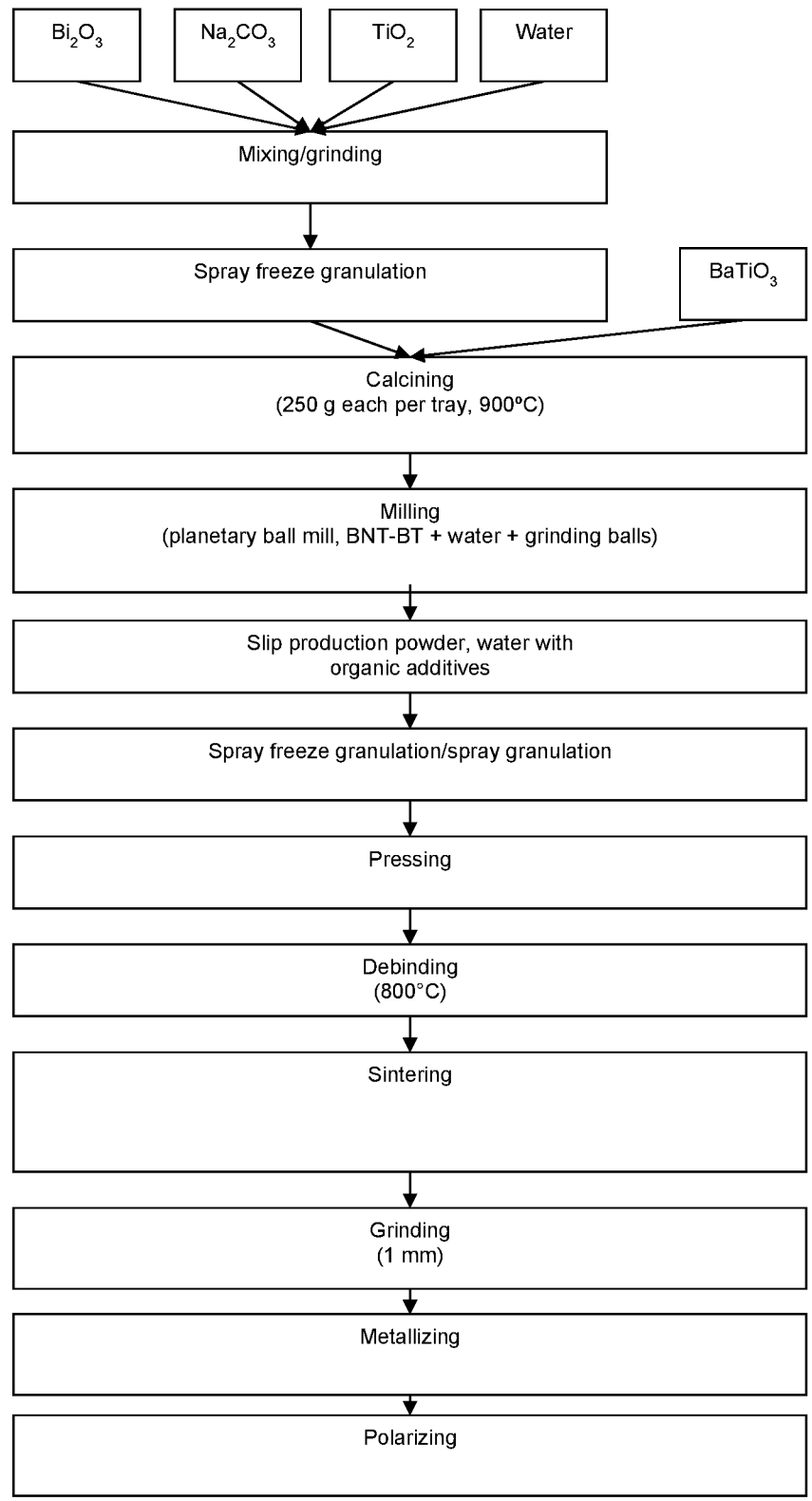

PRODUCTION OF LEAD-FREE PIEZOCERAMICS IN AQUEOUS SURROUNDINGS

CROSS-REFERENCE TO RELATED APPLICATIONS

This application is a U.S. national phase application filed under 35 U.S.C. § 371 of International Application No. PCT/EP2016/068877, filed Aug. 8, 2016, designating the United States, which claims priority from German Patent Application No. 102015215124.7, filed Aug. 7, 2015, and German Patent Application No. 102015226082.8, filed Dec. 18, 2015 which are hereby incorporated herein by reference in their entirety.

BACKGROUND OF THE INVENTION

The present invention relates to a method for producing ceramics having piezoelectric properties in predominantly aqueous suspending agents.

In the prior art, a method for producing piezoelectric ceramics is known in which organic suspending agents are used. Aqueous dispersions are likewise known in the production of piezoelectric ceramics, such as bismuth sodium titanate (BNT) or bismuth sodium titanate-barium titanate (BNT-BT) ceramics.

The disadvantage of the methods known from the prior art using aqueous dispersions is that soluble components, such as alkalis, can be dissolved out in the preprocessing of these aqueous dispersions and can segregate during drying. This results in the problem that the dissolved substances are inhomogeneously distributed in the ceramic, and the ceramic thus has poor piezoelectric values.

BRIEF SUMMARY OF THE INVENTION

It was the object of the present invention to develop a method that does not have the aforementioned drawbacks. The object is achieved by the method according to the invention for producing ceramics having piezoelectric properties, in which predominantly aqueous suspending agents are used. The produced ceramic having piezoelectric properties is preferably lead-free, and, particularly preferred, the produced ceramic having piezoelectric properties is a bismuth sodium titanate (BNT), bismuth sodium titanate-barium titanate (BNT-BT), potassium sodium niobate (KNN) or bismuth sodium titanate-potassium sodium niobate (BNT-KNN) ceramic or mixtures thereof.

BRIEF DESCRIPTION OF THE DRAWING

FIG. 1 is a flow chart showing the procedure of Example 1.

DETAILED DESCRIPTION OF THE INVENTION

According to the invention, the method for producing ceramics having piezoelectric properties comprises mixing the raw materials, milling, producing the pressed granules, and further steps, such as freezing the isotropic distribution, and subsequent temperature treatment.

A method according to the invention for producing a piezoelectric element comprises the following steps:
a) mixing the raw materials;
b) milling the raw materials;
c) granulating the milled raw materials mixture, such as spray freeze granulation;
d) calcining;
e) producing a slip comprising the calcinate;
f) granulating the slip;
g) producing the compact;
h) debinding and sintering;
i) metallizing and polarizing.

The method steps of mixing the raw materials and milling are carried out in predominantly aqueous suspending agents (proportion of water in the suspending agent >80%, preferably >90%), and process control prevents the soluble components from segregating from the insoluble components, which results in inhomogeneous materials.

According to the invention, the suspension thus prepared for producing lead-free piezoceramics comprises 40 to 60% ceramics, preferably selected from bismuth sodium titanate (BNT), bismuth sodium titanate-barium titanate (BNT-BT), potassium sodium niobate (KNN) or bismuth sodium titanate-potassium sodium niobate (BNT-KNN) ceramic, or mixtures thereof, 40 to 60% water, and <20%, preferably <5% (organic) additives.

The segregation of the soluble components from the insoluble components is in particular prevented by fixing the isotropic distribution present in the aqueous suspension, and subsequently removing the suspending medium, without segregation occurring.

The fixing of the isotropic distribution may take place by freezing the suspension, for example. Freezing preferably takes place in a freezing medium (liquid, solid or gaseous), having a temperature below the melting temperature of the suspension. The temperature of the freezing medium is preferably far below the melting temperature of the suspension, and in particular >10 K below the melting temperature of the suspension, and allows rapid freezing of the suspension.

The freezing medium is selected from the group consisting of liquid or gaseous nitrogen, liquid or gaseous air, liquid or gaseous oxygen, other liquid or gaseous organic or inorganic media, and preferably liquid nitrogen.

The fixing of the isotropic distribution by way of a phase change may also take place by freezing the suspension using physical methods, such as pressure changes, solid media or similar methods. The fixing may also take place by way of a gelling process or the like, such as by way of a change in the pH value (zeta potential). On the other hand, it is also possible for the fixing to take place by way of flocculation, such as by way of a change in the pH value (zeta potential) of the dispersion. It is also possible to add one or more additives so as to achieve fixing.

According to the invention, the removal of the suspending agent is carried out under exclusion of capillary forces and without any noteworthy liquid phase being created, whereby the frozen distribution is preserved. The suspending agent is preferably removed by way of sublimation of the predominantly aqueous suspending agent up to a certain low residual moisture content (<5%, preferably <3%) under suitable pressure (<1 bar, preferably <100 mbar)/temperature conditions.

In a preferred embodiment of the teaching according to the invention, the freezing takes place by way of injection into a freezing medium, preferably liquid nitrogen, whereby protogranules are created at the same time. As a result of freeze drying, these protogranules turn into granules that can be further processed.

The suspending agent, however, may also be removed by way of a chemical process, such as by way of decomposition.

The fixed distribution is transferred into the desired piezoelectric ceramic material by way of a reaction process. This reaction process is preferably a temperature treatment (calcination/mixed oxide process) of the fixed distribution, whereby a calcinate is formed.

A compressible powder can be produced from the calcinate thus formed. For this purpose, initially a slip is provided. According to the invention, the suspension thus created for producing lead-free piezoceramics comprises 40 to 60% ceramics, preferably selected from bismuth sodium titanate (BNT), bismuth sodium titanate-barium titanate (BNT-BT), potassium sodium niobate (KNN) or bismuth sodium titanate-potassium sodium niobate (BNT-KNN) ceramic, or mixtures thereof, 40 to 60% water, and <20%, preferably <5% (organic) additives.

A powder is produced from the slip by way of spray drying or other granulation processes. Spray freeze granulation or spray drying is preferably such a granulation process for producing a compressible powder from the calcinate.

The method according to the invention will be described hereafter based on Example 1 of producing a bismuth sodium titanate-barium titanate (BNT-BT) ceramic, without thereby limiting the invention.

EXAMPLE 1

The method is carried out based on the following method steps:

1) Production of the $Bi_2O_3$—$Na_2CO_3$—$TiO_2$ Suspension $Bi_2O_3$, $Na_2CO_3$, $TiO_2$, water and grinding balls were weighed in a container. This suspension was subsequently homogenized or deagglomerated.

2) Spray Freeze Granulation of the $Bi_2O_3$—$Na_2CO_3$—$TiO_2$ Suspension

The ceramic suspension was sprayed in trays filled with liquid nitrogen and thereby flash-frozen. The slip was supplied by way of a hose connection via the reservoir. The product trays were filled with liquid nitrogen at the start of every spraying process. Due to evaporation of the liquid nitrogen, the fill level was checked regularly between the spray units, and nitrogen was replenished if needed. This ensured that the frozen droplets were continuously covered with liquid nitrogen, so as to prevent the slip from melting again. After the spraying process, the product trays containing the frozen slip droplets and the liquid nitrogen were placed in a freeze dryer. As soon as the liquid nitrogen had fully evaporated, except for minor residue, the freeze-drying process was started, which is to say the pressure in the freeze dryer was lowered. A time of approximately 24 h was established for the main drying process of the granules. A subsequent drying step was dispensed with.

3) Production of the $Bi_2O3$-$Na_2CO_3$—$TiO_2$—$BaTiO_3$ Powder Mixtures

For the $Bi_2O3$-$Na_2CO_3$—$TiO_2$—$BaTiO_3$ powder mixtures, the spray freeze granules and the $BaTiO_3$ powder were weighed in different proportions (see Table 1) in containers. After the addition of several grinding balls, the containers were placed on a cylinder mill and mixed until dry so as to generate a homogeneous powder mixture.

TABLE 1

Molar ratios of the raw materials

| Molar ratio | |
|---|---|
| BT | BNT |
| 0.055 | 0.945 |
| 0.06 | 0.94 |
| 0.065 | 0.935 |
| 0.07 | 0.93 |
| 0.075 | 0.925 |
| 0.08 | 0.92 |
| 0 | 1 |

4) Calcination

The $Bi_2O_3$—$Na_2CO_3$—$TiO_2$—$BaTiO_3$ powder mixtures were distributed among trays. The calcination of the powder mixtures to yield BNT-BT was carried out at 900° C.

5) BNT-BT Slip Production

Following the calcination, the BNT-BT powders were milled using a planetary ball mill. After the grinding ball had been separated, organic additives were added to the slips. The slips were homogenized again on the cylinder mill.

6) Spray Freeze Granulation of the BNT-BT Slip

Analogous to step 2)

7) Pressing of the BNT-BT Components

The compacts were produced with the aid of a uniaxial press using a pressing pressure of approximately 200 MPa.

8) Debinding and Sintering

The green compacts were debound at 800° C. Thereafter, the pressed bodies were placed in capsules and sintered.

9) Metallizing and Polarizing

The thickness of the sintered tablets was set to 1 mm by grinding of the surfaces. The metallization on both sides took place using a silver paste, which was applied by way of screen printing and baked at 700 to 900° C. For polarization, a trapezoidal voltage profile was applied, wherein the maximum voltage was varied between 2 and 5 kV.

To provide a better understanding, the procedure of Example 1 is shown as a flow chart in FIG. 1.

In this way, different piezoceramics were produced, the characteristic parameters of which were determined by way of the methods defined in DIN 50324 1-3 (status date: December 2002).

TABLE 2

Test results for piezoceramics according to the invention

| | BNT-BT6 | BNT |
|---|---|---|
| $d_{33}$ (pC/N) | 200 | 87 |
| $k_p$ (%) | 30 | 16 |
| $k_t$ (%) | 50 | 44 |
| $\varepsilon^T_{33}/\varepsilon_0$ | 1000 | 460 |
| $\rho$ (g/cm$^3$) | 5.8 | 5.8 |

The invention claimed is:

1. A method for producing a ceramic having piezoelectric properties, comprising:

mixing and grinding raw materials for producing a lead-free ceramic in a predominantly aqueous suspending agent to obtain a suspension with an isotropic distribution;

fixing the isotropic distribution of the suspension by freezing of the suspension, wherein the freezing takes place by spraying the suspension into a freezing medium, whereby protogranules are created;

removing the suspending agent by sublimation; and transferring the fixed isotropic distribution into a piezoelectric ceramic material by calcination and/or mixed-oxide process to yield a calcinate.

2. The method for producing a ceramic having piezoelectric properties according to claim 1, wherein the freezing takes place in a liquid, solid or gaseous freezing medium.

3. The method for producing a ceramic having piezoelectric properties according to claim 2, wherein the temperature of the freezing medium is below the melting temperature of the suspension.

4. The method for producing a ceramic having piezoelectric properties according to claim 3, wherein the suspension is flash-frozen.

5. The method for producing a ceramic having piezoelectric properties according to claim 2, wherein the freezing medium is selected from the group consisting of liquid or gaseous nitrogen, liquid or gaseous air, liquid or gaseous oxygen, or other liquid or gaseous organic or inorganic media.

6. The method for producing a ceramic having piezoelectric properties according to claim 1, wherein the fixed isotropic distribution is transferred into the piezoelectric ceramic material by a mixed-oxide process.

7. The method for producing a ceramic having piezoelectric properties according to claim 1, wherein the fixed isotropic distribution is transferred into the piezoelectric ceramic material by calcination.

8. The method for producing a ceramic having piezoelectric properties according to claim 7, wherein a compressible powder is produced from the calcinate by way of a granulation process.

9. The method for producing a ceramic having piezoelectric properties according to claim 1, wherein the suspension comprises ceramics selected from bismuth sodium titanate (BNT), bismuth sodium titanate-barium titanate (BNT-BT), potassium sodium niobate (KNN) or bismuth sodium titanate-potassium sodium niobate (BNT-KNN) ceramic, or mixtures thereof, water, and organic additives.

10. The method for producing a ceramic having piezoelectric properties according to claim 1, wherein the freezing medium comprises liquid nitrogen.

11. The method for producing a ceramic having piezoelectric properties according to claim 1, wherein the temperature of the freezing medium is greater than 10° K below the melting temperature of the suspension such that spraying the suspension into the freezing medium causes the suspension to be flash frozen.

12. The method for producing a ceramic having piezoelectric properties according to claim 1, wherein the suspension comprises ceramics selected from bismuth sodium titanate (BNT), bismuth sodium titanate-barium titanate (BNT-BT), potassium sodium niobate (KNN) or bismuth sodium titanate-potassium sodium niobate (BNT-KNN) ceramic, or mixtures thereof, water, and additives.

13. The method for producing a ceramic having piezoelectric properties according to claim 1, wherein the suspension comprises ceramics selected from bismuth sodium titanate (BNT), bismuth sodium titanate-barium titanate (BNT-BT), potassium sodium niobate (KNN) or bismuth sodium titanate-potassium sodium niobate (BNT-KNN) ceramic, or mixtures thereof, and water.

* * * * *